(12) United States Patent
Noguchi et al.

(10) Patent No.: US 6,312,800 B1
(45) Date of Patent: *Nov. 6, 2001

(54) PRESSURE SENSITIVE ADHESIVE SHEET FOR PRODUCING A CHIP

(75) Inventors: Hayato Noguchi, Urawa; Kazuyoshi Ebe, Saitama, both of (JP)

(73) Assignee: Lintec Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/019,608

(22) Filed: Feb. 6, 1998

(30) Foreign Application Priority Data

Feb. 10, 1997 (JP) .................................................. 9-026571

(51) Int. Cl.[7] .................................. B32B 7/12; C09J 7/02
(52) U.S. Cl. ......................... 428/354; 428/343; 428/910
(58) Field of Search ................................. 428/343, 910, 428/354

(56) References Cited

U.S. PATENT DOCUMENTS

| | | | |
|---|---|---|---|
| 4,756,968 | 7/1988 | Ebe et al. | 428/343 |
| 4,965,127 | 10/1990 | Ebe et al. | 428/343 |
| 5,110,388 | 5/1992 | Komiyama et al. | 156/229 |
| 5,118,567 | 6/1992 | Komiyama et al. | 428/345 |
| 5,187,007 | 2/1993 | Ebe et al. | 428/343 |
| 5,238,876 | 8/1993 | Takeuchi et al. | 437/226 |
| 5,252,694 | * 10/1993 | Willett | 525/404 |
| 5,281,473 | * 1/1994 | Ishiwata | 428/345 |
| 5,356,949 | 10/1994 | Komiyama et al. | 522/102 |
| 5,538,771 | * 7/1996 | Nakayama | 428/41.3 |
| 5,670,260 | * 9/1997 | Zajaczkowski | 428/345 |
| 5,759,874 | * 6/1998 | Okawa | 438/124 |
| 5,851,664 | * 12/1998 | Bennet | 428/355 |
| 5,942,578 | * 8/1999 | Noguchi | 525/228 |
| 5,976,691 | * 11/1999 | Noguchi | 428/354 |

FOREIGN PATENT DOCUMENTS

| | | |
|---|---|---|
| 0530729 | 10/1993 | (EP) . |
| 0622833 | 2/1994 | (EP) . |

\* cited by examiner

Primary Examiner—Daniel Zirker
(74) Attorney, Agent, or Firm—Webb Ziesenheim Logsdon Orkin & Hanson, P.C.

(57) ABSTRACT

A process for producing a chip, comprising the steps of:
   setting an object to be diced on a pressure sensitive adhesive sheet for producing chip comprising at least one layer of shrinkable film, an expansible film and a pressure sensitive adhesive layer for setting the object;
   fixing edges of the pressure sensitive adhesive sheet for producing chip;
   dicing the object into chips, and
   shrinking the shrinkable film to thereby expand chip spacings. In the process for producing small chips such as semiconductor chips, chip spacings can be expanded without the need to conduct the conventional expansion step.

11 Claims, 3 Drawing Sheets

PRESSURE SENSITIVE ADHESIVE SHEET FOR PRODUCING A CHIP

FIELD OF THE INVENTION

The present invention relates to a process for producing a chip and a pressure sensitive adhesive sheet for producing chip. More particularly, the present invention is concerned with a process for producing small chips such as semiconductor chips in which chip spacings can be expanded without the need to conduct the conventional expansion step and a pressure sensitive adhesive sheet for producing chip suitably employed in this process.

BACKGROUND OF THE INVENTION

A semiconductor wafer of, for example, silicon or gallium arsenide is produced in a large diameter, cut and separated (diced) into elemental chips and subjected to the subsequent mounting step. In this process, the semiconductor wafer undergoes dicing, expansion and picking-up steps in the state of being attached to a pressure sensitive adhesive sheet and is transferred to the subsequent mounting step.

In the expansion step, the pressure sensitive adhesive sheet is extended so that chip spacings are expanded. The objective of the expansion step in which chip spacings are expanded is to facilitate chip recognition in the die bonding and to prevent device breakage attributed to abuttal of neighboring chips in the pickup step.

Currently, the expansion step is carried out by extending the pressure sensitive adhesive sheet with the use of an expanding apparatus.

In most expanding apparatuses, the degree of extension and the torque during the extension are fixed to thereby render difficult adjusting dependent upon the type of pressure sensitive adhesive sheet and the size of device.

Accordingly, it has occurred that, when the pressure sensitive adhesive sheet is soft, the extending stress is not conveyed to the object setting portion to thereby disenable attaining satisfactory chip spacings and that, on the other hand when the pressure sensitive adhesive sheet is hard, the torque of the apparatus is unsatisfactory or the pressure sensitive adhesive sheet is torn.

Further, when the die bonding is completed, the pressure sensitive adhesive sheet is housed, in the state of being set on a ring frame, into a ring frame cassette. In the conventional process, the pressure sensitive adhesive sheet having been deformed by the expansion must have its shape restored to the original by the use of hot air. When the restoration of the shape is unsatisfactory, the pressure sensitive adhesive side of the pressure sensitive adhesive sheet occasionally adheres to the ring frame cassette to thereby disenable housing thereof. Thus, an automization has been difficult.

The present invention has been made with a view toward resolving the above problem of the prior art. An object of the present invention is to provide a process for producing a chip in which chip spacings can be expanded according to mechanism which is radically different from the conventional expansion method, and another object of the present invention is to provide a pressure sensitive adhesive sheet for producing chip suitably employed in the above process.

SUMMARY OF THE INVENTION

The process for producing a chip according to the present invention comprises the steps of:

setting an object to be diced on a pressure sensitive adhesive sheet for producing chip comprising at least one layer of shrinkable film, an expansible film and a pressure sensitive adhesive layer for setting the object;

fixing edges of the pressure sensitive adhesive sheet for producing chip;

dicing the object into chips, and shrinking the shrinkable film to thereby expand chip spacings.

The pressure sensitive adhesive sheet for producing chip of the present invention is suitably used in the above process and comprises a zone for setting an object to be diced including an expansible film and a pressure sensitive adhesive layer for setting the object and a shrinkage zone including at least one layer of shrinkable film, wherein the shrinkage zone is arranged at least outside the zone for setting the object.

Figure 1:
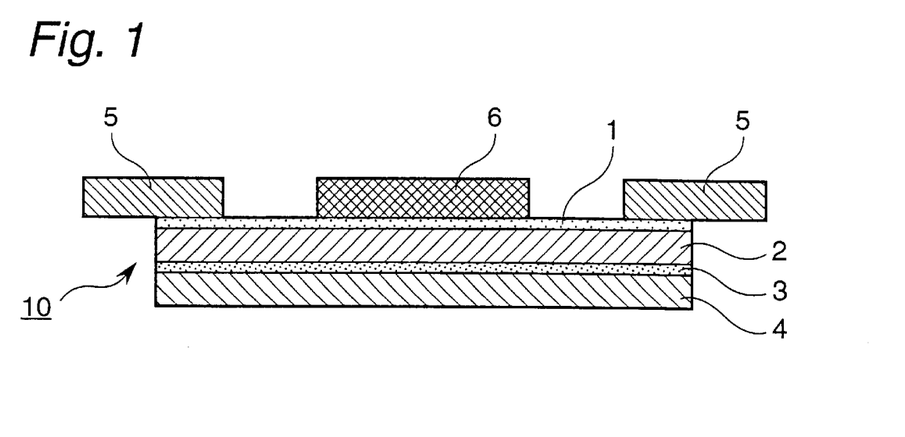
FIGS. 1 to 7 show variety of pressure sensitive adhesive sheet for producing chip for use in the present invention.
Figure 2:
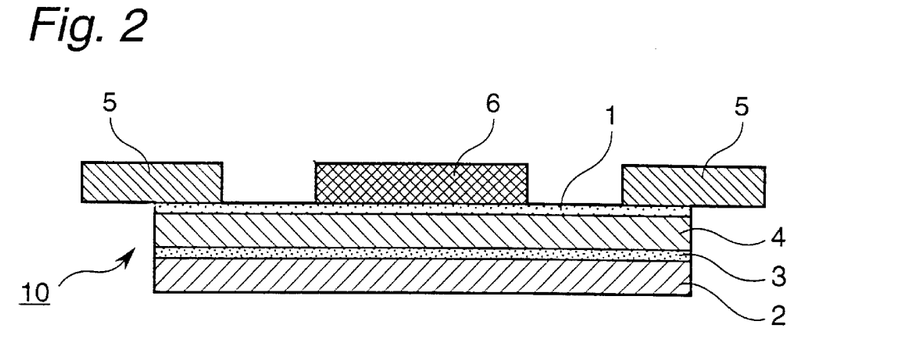

Preferred pressure sensitive adhesive sheet for producing chip is, for example, one wherein the pressure sensitive adhesive layer for setting the object, the shrinkable film and the expansible film are laminated in this order as shown in FIG. 1 or one wherein the pressure sensitive adhesive layer for setting the object, the expansible film and the shrinkable film are laminated in this order as shown in FIG. 2.

In the present invention, it is preferred that the expansible film have an elastic modulus of less than $1 \times 10^9$ N/m² and that the pressure sensitive adhesive layer for setting the object be composed of a radiation curable pressure sensitive adhesive.

Further, it is preferred that the shrinkable film and the expansible film are laminated via an adhesive layer having an elastic modulus of at least $1.0 \times 10^5$ N/m².

DETAILED DESCRIPTION OF THE INVENTION

The process for producing a chip and the pressure sensitive adhesive sheet for producing chip according to the present invention will be described in detail below.

In the process for producing a chip according to the present invention, use is made of a pressure sensitive adhesive sheet for producing chip comprising at least one layer of shrinkable film, an expansible film and a pressure sensitive adhesive layer for setting the object. Although the shrinkable film is not particularly limited, a thermally shrinkable film is preferentially employed.

The shrinkage ratio of the shrinkable film employed in the present invention preferably ranges from 10 to 90% and, still preferably, from 20 to 80%. The shrinkage ratio is calculated from the size prior to shrinkage and the size after shrinkage by the following formula:

Shrinkage ratio (%)=[(size prior to shrinkage)−(size after shrinkage)]/(size prior to shrinkage)×100.

In the use of the thermally shrinkable film, the above shrinkage ratio is calculated from the sizes of the film prior to and after heating at 120° C.

Various shrinkable films of the above type are known, and any thereof can be used in the present invention as long as the object does not suffer from adverse effects such as ion contamination therefrom. Examples of suitable shrinkable films include uniaxially and biaxially oriented films such as those of polyethylene terephthalate, polyethylene, polystyrene, polypropylene, polyamide, polyurethane, polyvinylidene chloride and polyvinyl chloride. These shrinkable films can be used in combination.

The thickness of the above shrinkable film generally ranges from 5 to 300 μm, preferably, from 10 to 200 μm.

In particular, thermally shrinkable polyethylene, polypropylene and polyethylene terephthalate films are preferably used as the shrinkable film.

The substrate of the pressure sensitive adhesive sheet for producing chip for use in the process of the present invention is a combination of the above shrinkable film and an expansible film.

Although the expansible film is not particularly limited, it is preferred that the expansible film have high water and heat resistances and be composed of a synthetic resin.

Examples of suitable expansible films include films of low density polyethylene (LDPE), linear low density polyethylene (LLDPE), ethylene/propylene copolymer, polypropylene, polybutene, polybutadiene, polymethylpentene, ethylene/vinyl acetate copolymer, ethylene/(meth)acrylic acid copolymer, ethylene/methyl (meth)acrylate copolymer, ethylene/ethyl (meth)acrylate copolymer, polyvinyl chloride, vinyl chloride/vinyl acetate copolymer, ethylene/vinyl chloride/vinyl acetate copolymer, polyurethanes, polyamides and ionomers. These expansible films can be used in combination. Moreover, use can be made of a film of a polymer of a compound having a carboxyl group as a polymer structural unit and a laminate of this film and a generally employed polymer film.

The thickness of the above expansible film generally ranges from 5 to 500 μm, preferably, from 10 to 300 μm.

It is generally preferred that the elastic modulus at 23° C. of the expansible film for use in the present invention be less than $1 \times 10^9$ N/m$^2$, especially, in the range of $1 \times 10^7$ to $1 \times 10^9$ N/m$^2$.

The side brought into contact with another layer of the shrinkable film or expansible film may be provided with corona treatment or may have a primer or other layer attached thereto for improving the adherence.

In the present invention, the pressure sensitive adhesive layer for setting the object may be irradiated with ultraviolet rays prior to or after shrinking the films, as described later. When the irradiation is effected, the films constituting the substrate must be transparent.

The pressure sensitive adhesive layer for setting the object of the pressure sensitive adhesive sheet for producing chip can be produced from various conventional pressure sensitive adhesives. These pressure sensitive adhesives are not particularly limited and some examples thereof include pressure sensitive adhesives based on a rubber, an acrylic, a silicone and a polyvinyl ether. Also, use can be made of pressure sensitive adhesives which are curable by radiation and pressure sensitive adhesives which foam when heated. Further, use can be made of adhesives usable in both dicing and die bonding.

Although depending on the properties of the materials thereof, the thickness of the pressure sensitive adhesive layer for setting the object generally ranges from about 3 to 100 μm, preferably, from about 10 to 50 μm.

As mentioned above, various pressure sensitive adhesives are used without any particular limitation. For example, those described in Japanese Patent Publication Nos. 1(1989)-56112 and 7(1995)-15087 and Japanese Patent Laid-Open Publication No. 7(1995)-135189 can preferably be used as the pressure sensitive adhesives curable by radiation (curable by light, ultraviolet rays or electron beams), which, however, do not limit the radiation curable pressure sensitive adhesives for use in the present invention. Nevertheless, the use of pressure sensitive adhesives curable by ultraviolet rays is especially preferred in the present invention.

Figure 3:
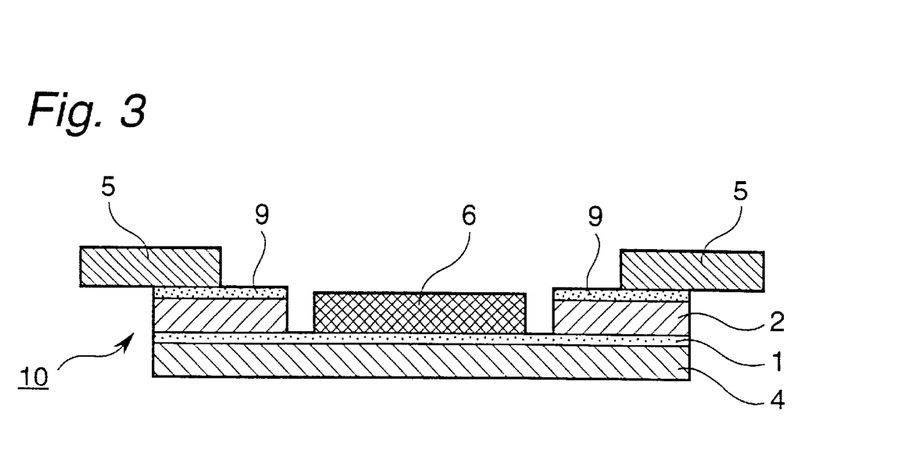
Figure 4:
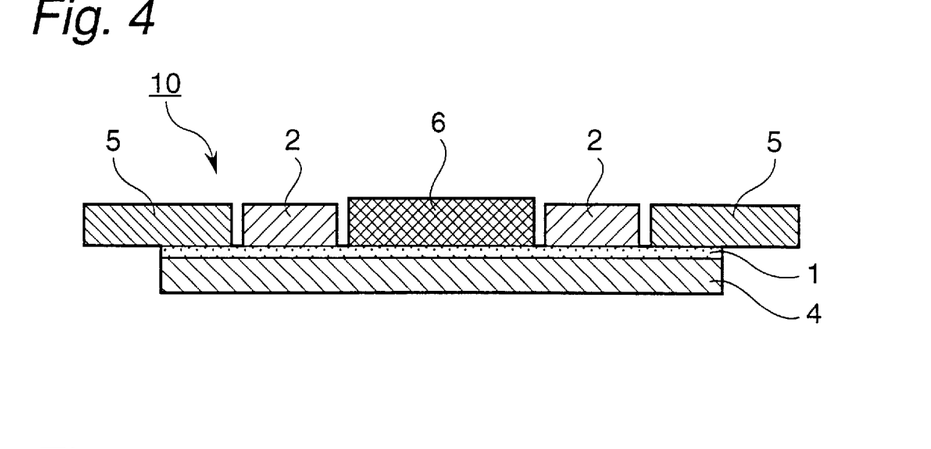
Figure 5:
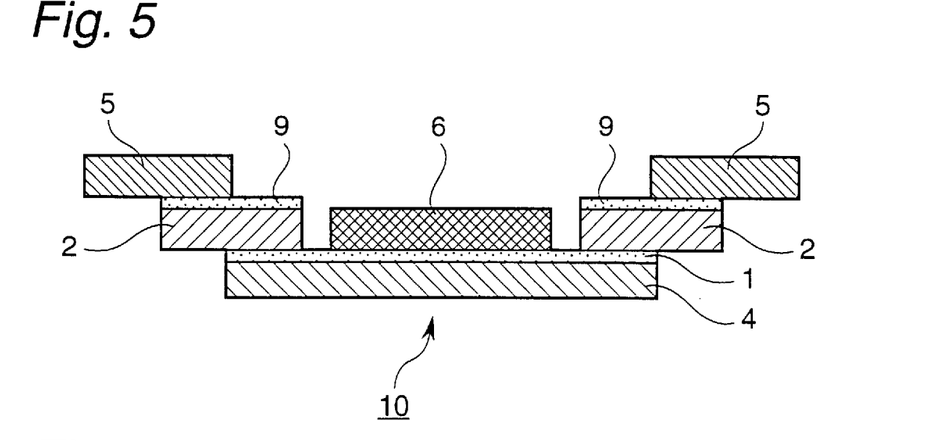

In the present invention, the shrinkable film and the expansible film are bonded together in various configurations as described below. The pressure sensitive adhesive layer for setting the object can be used in the film bonding, as shown in FIGS. 3 to 5. Also, other adhesive layers can be applied as shown in FIGS. 1, 2, 6 and 7. This adhesive is not particularly limited and generally used adhesives may be employed. Examples of suitable adhesives include adhesives such as those based on an acrylic, a rubber and a silicone; thermoplastic or thermosetting adhesives such as those based on a polyester, a polyamide, an ethylene copolymer, an epoxy and a urethane; and adhesive curable by ultraviolet rays on electron beams such as those based on an acrylic and a urethane. Especially, it is preferred to employ the adhesive having an elastic modulus of at least $1.0 \times 10^5$ N/m$^2$, preferably at least $1.0 \times 10^7$ N/m$^2$. The use of such adhesive enables the uniform shrinkage of shrinkable film to prevent the exposure of the adhesive, thereby smoothly picking up the chips. The film bonding can be effected without the use of an adhesive, for example, by laminating the shrinkable film to the expansible film according to, for example, the heat seal technique.

When the shrinkable film is arranged at a position where the ring frame is fixed as shown in FIGS. 3 and 5, a pressure sensitive adhesive layer for immobilizing the ring frame can be disposed on the shrinkable film. The pressure sensitive adhesive layer for immobilizing the ring frame can be composed of the same various conventional pressure sensitive adhesives as in the pressure sensitive adhesive layer for setting the object.

The pressure sensitive adhesive sheet for producing chip is used in the state of having an object to be diced set on the pressure sensitive adhesive layer for setting the object at the zone for setting the object and in the state of having its edges fixed by means of, for example, a ring frame. The set object is diced into chips, and the shrinkable film is shrunk. Then, an extending stress is generated by the shrinkable film arranged outside the zone for setting the object (shrinkage zone) to thereby expand chip spacings. In this process of the present invention, it is preferred that the shrinkable film of the pressure sensitive adhesive sheet for producing chip be arranged at least outside the zone for setting the object.

Preferred structures of the pressure sensitive adhesive sheets 10 for producing chip for use in the present invention together with the positional relationships of the ring frame 5 and the object 6 are as shown in FIGS. 1 to 7. Actual Examples and preferred forms of the pressure sensitive adhesive layers 1 for setting the object, shrinkable films 2, adhesive layers 3 and expansible films 4 are as described above. The adhesive layer 3 is not always essential as mentioned above.

In the pressure sensitive adhesive sheet 10 for producing chip of FIG. 1, the shrinkable film 2 is laminated through the adhesive layer 3 to an entire surface of the expansible film 4, and the pressure sensitive adhesive layer 1 for setting the object 6 is disposed on the opposite entire surface of the shrinkable film 2. Edges of the pressure sensitive adhesive sheet 10 for producing chip are fixed by means of the ring frame 5 on the pressure sensitive adhesive layer 1 for setting the object 6 at its periphery. The object 6 is set on the pressure sensitive adhesive layer 1 for setting the object 6 inside its periphery.

In the pressure sensitive adhesive sheet 10 for producing chip of FIG. 2, the expansible film 4 is laminated through the adhesive layer 3 to an entire surface of the shrinkable film 2, and the pressure sensitive adhesive layer 1 for setting the object 6 is disposed on the opposite entire surface of the expansible film 4. Edges of the pressure sensitive adhesive sheet 10 for producing chip are fixed by means of the ring frame 5 on the pressure sensitive adhesive layer 1 for setting the object 6 at its periphery. The object 6 is set on the pressure sensitive adhesive layer 1 for setting the object 6 inside its periphery.

In the pressure sensitive adhesive sheet 10 for producing chip of FIG. 3, the pressure sensitive adhesive layer 1 for setting the object 6 is disposed on the expansible film 4, and the shrinkable film 2 is laminated to a peripheral part of the pressure sensitive adhesive layer 1 for setting the object 6. The pressure sensitive adhesive sheet 10 for producing chip on its shrinkable film 2 is fixed by means of the ring frame 5, and the object 6 is set on the pressure sensitive adhesive layer 1 for setting the object 6. In this structure, it is preferred that the pressure sensitive adhesive layer 9 for immobilizing the ring frame be applied onto the shrinkable film 2.

In the pressure sensitive adhesive sheet 10 for producing chip of FIG. 4, the pressure sensitive adhesive layer 1 for setting the object 6 is disposed on the expansible film 4, and the shrinkable film 2 is laminated onto the pressure sensitive adhesive layer 1 for setting the object 6 outside the zone for setting the object 6 but inside the part where the pressure sensitive adhesive sheet 10 for producing chip is fixed. Edges of the pressure sensitive adhesive sheet 10 for producing chip are fixed by means of the ring frame 5 on the pressure sensitive adhesive layer 1 for setting the object 6 at its periphery. The object 6 is set on the pressure sensitive adhesive layer 1 for setting the object 6 inside its periphery.

In the pressure sensitive adhesive sheet 10 for producing chip of FIG. 5, the pressure sensitive adhesive layer 1 for setting the object 6 is disposed on the expansible film 4, and the shrinkable film 2 is laminated with its outer periphery protruding onto the pressure sensitive adhesive layer 1 for setting the object 6 at its periphery. The pressure sensitive adhesive sheet 10 for producing chip is fixed by means of the ring frame 5 on the protruding outer periphery of the shrinkable film 2, and the object 6 is set on the pressure sensitive adhesive layer 1 for setting the object 6. In this structure, it is preferred that the pressure sensitive adhesive layer 9 for immobilizing the ring frame be applied onto the shrinkable film 2.

Figure 6:
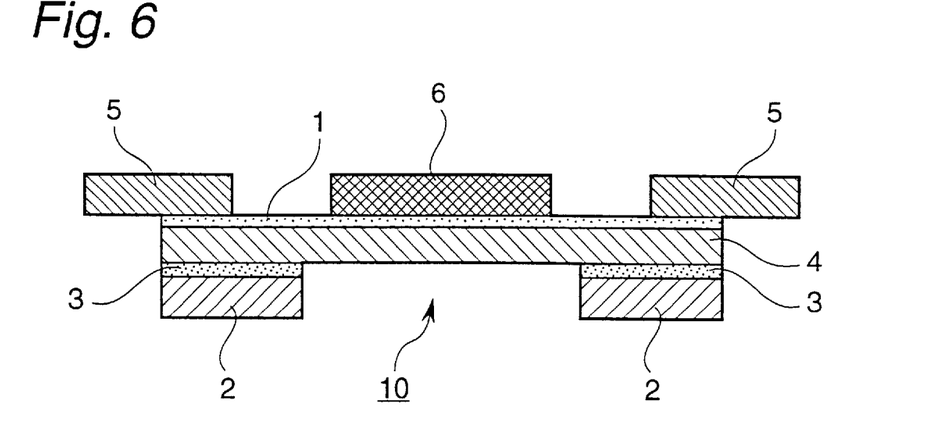

In the pressure sensitive adhesive sheet 10 for producing chip of FIG. 6, the shrinkable film 2 is laminated through the adhesive layer 3 onto the periphery of the lower side of the expansible film 4, and the pressure sensitive adhesive layer 1 for setting the object 6 is disposed on the upper side of the expansible film 4. Edges of the pressure sensitive adhesive sheet 10 for producing chip are fixed by means of the ring frame 5 on the pressure sensitive adhesive layer 1 for setting the object 6 at its periphery. The object 6 is set on the pressure sensitive adhesive layer 1 for setting the object 6 inside its periphery.

Figure 7:
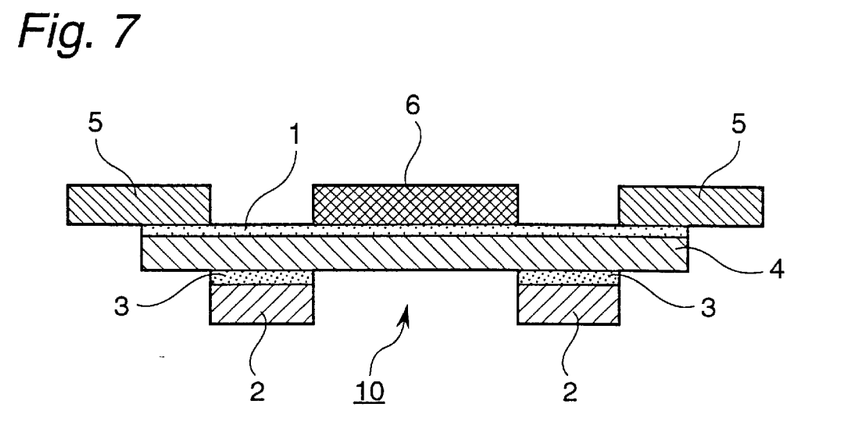

In the pressure sensitive adhesive sheet 10 for producing chip of FIG. 7, the shrinkable film 2 is laminated through the adhesive layer 3 onto part of the lower side of the expansible film 4, which part locates outside the zone for setting the object and inside the zone where the pressure sensitive adhesive sheet 10 for producing chip is fixed. The pressure sensitive adhesive layer 1 for setting the object 6 is disposed on the upper side of the expansible film 4. Edges of the pressure sensitive adhesive sheet 10 for producing chip are fixed by means of the ring frame 5 on the pressure sensitive adhesive layer 1 for setting the object 6 at its periphery. The object 6 is set on the pressure sensitive adhesive layer 1 for setting the object 6 inside its periphery.

In the present invention, it is especially desirable to employ the pressure sensitive adhesive sheet 10 for producing chip with the structure of FIG. 1 or FIG. 2.

The process for producing a chip according to the present invention will be described below using the pressure sensitive adhesive sheet 10 for producing chip shown in FIG. 1. The object 6 is set on the pressure sensitive adhesive layer 1 for setting the object 6 of the pressure sensitive adhesive sheet 10 for producing chip. The pressure sensitive adhesive sheet 10 for producing chip is fixed by means of the ring frame 5, and the object 6 is cut (diced) into chips 7.

The object 6 to be diced include, for example, a semiconductor wafer having a circuit formed thereon such as Si wafer, Ge wafer and GaAs wafer;

a ceramic plate such as alumina, zirconia, silicon nitride and silicon carbide, insulating substrate and electronic devices;

a glass plate, quarts and the like used as optical element;

a wiring board such as printed circuit board;

a lead frame made of iron or copper;

a tape for TAB (tape automated bonding);

resin molded articles; and composite devices of above, such as a semiconductor mounted on the lead frame, resin sealed thereof and resin sealed semiconductor mounted on the tape for TAB.

Figure 8:
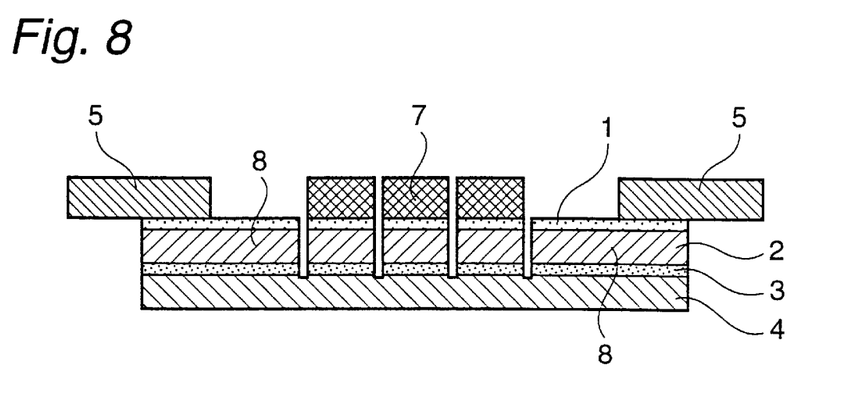
FIGS. 8 and 9 show process for producing a chip according to the present invention.

The cutting depth is preferably such that the shrinkable film 2 is completely cut while the cutting of the expansible film 4 is halted before reaching the middle thereof (see FIG. 8). The shrinkage restricting force is weakened by the complete cutting of the shrinkable film 2, so that the shrinking performance of the shrinkable film 2 can fully be exerted at zone designated "8" in FIG. 8 (namely, outside the zone for setting the object 6 and inside the zone where the pressure sensitive adhesive sheet 10 for producing chip is fixed).

Subsequently, the shrinkable film 2 is shrunk by appropriate means required. When a thermally shrinkable film is employed, the shrinkage of the shrinkable film 2 is effected by heating the laminate of the chips 7 and the pressure sensitive adhesive sheet 10 for producing chip at 60 to 150° C.

Figure 9:
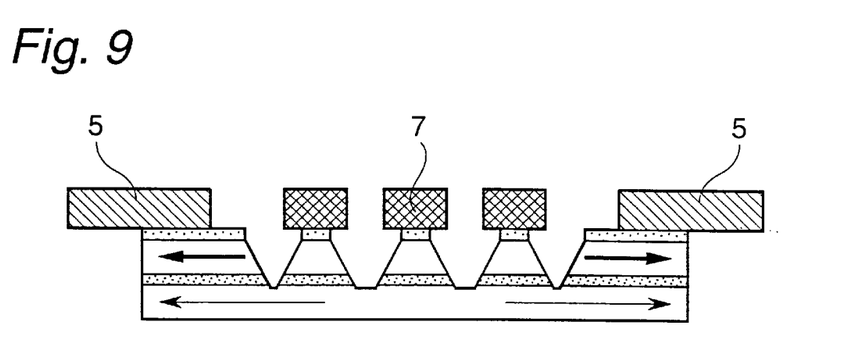

The above shrinkage of the shrinkable film 2 causes the pressure sensitive adhesive layer 1 for setting the object 6 disposed thereon to deform in conformity with the shrinkage of the shrinkable film 2, so that not only is the area in which the chips 7 are in contact with the pressure sensitive adhesive layer 1 for setting the object 6 reduced but also the chip spacings are uniformly enlarged in both longitudinal and lateral directions (see FIG. 9). This is because, referring to FIG. 9, a shrinking stress (indicated by the arrow in FIG. 9) is generated in the shrinkable film 2 at noncut part 8 which is present between the zone for setting the object and the ring frame 5 for fixing the pressure sensitive adhesive sheet 10 for producing chip, so that a tension is applied into the expansible film 4 with the result that the expansible film 4 is drawn toward the ring frame 5. Consequently, the same effect as that exerted by expanding the pressure sensitive adhesive sheet 10 for producing chip is obtained. Therefore, the chip spacings are uniformly enlarged, so that desirable bonder recognition can be realized without the need to carry out the expansion step.

When the pressure sensitive adhesive sheet 10 for producing chip according to the present invention is employed in the production of a chip such as a slender line sensor, it is preferred that a uniaxially oriented film be used as the shrinkable film 2 with the direction of orientation thereof brought into agreement with the direction of short side of the chip from the viewpoint that the chip spacing difference is decreased between the longitudinal and lateral directions. The use of a biaxially oriented film is preferred for chips whose short and long sides are identical with each other or approximate to each other from the viewpoint that, also, the chip spacing difference is decreased between the longitudinal and lateral directions.

Moreover, in the present invention, the ratio of shrinkage of the shrinkable film 2 can be controlled by appropriately setting shrinkage conditions (temperature, time, etc.) of the shrinkable film 2, so that the ratio of expansion of the chip spacing can easily be changed.

Composing the pressure sensitive adhesive layer 1 for setting the object 6 of an ultraviolet curable pressure sensitive adhesive is especially preferred from the viewpoint that the adhesive strength thereof can be reduced by irradiating the pressure sensitive adhesive layer 1 for setting the object 6 with ultraviolet rays prior to or after the above shrinkage to thereby cure the pressure sensitive adhesive layer 1 for setting the object 6. The curing of the pressure sensitive adhesive layer 1 for setting the object 6 enables further reducing the vertical peeling strength with the result that the pickup of the chips 7 is facilitated.

The pressure sensitive adhesive sheet for producing chip of the present invention is suitably used in the above process for producing a chip and comprises a zone for setting an object to be diced including an expansible film 4 and a pressure sensitive adhesive layer 1 for setting the object 6 and a shrinkage zone including at least one layer of shrinkable film 2, wherein the shrinkage zone is arranged at least outside the zone for setting the object.

Examples of the pressure sensitive adhesive layers 1 for setting the object 6, shrinkable films 2 and expansible films 4 are the same as described hereinbefore. The bonding of the shrinkable film 2 and the expansible film 4 may be executed either with the use of the above-mentioned adhesive 3 or by direct means such as heat sealing.

Exemplary structures of the pressure sensitive adhesive sheets for producing the chips according to the present invention are as shown in FIGS. 1 to 7. Of these, it is especially preferred to employ the structure of FIG. 1 or FIG. 2.

That is, especially preferred pressure sensitive adhesive sheet for producing chip according to the present invention is, for example, one wherein the pressure sensitive adhesive layer 1 for setting the object 6, the shrinkable film and the expansible film are laminated on entire surfaces in this order as shown in FIG. 1 or one wherein the pressure sensitive adhesive layer 1 for setting the object 6, the expansible film and the shrinkable film are laminated on entire surfaces in this order as shown in FIG. 2.

Further, it is preferred that the expansible film have an elastic modulus of less than $1 \times 10^9$ N/m².

Still further, it is preferred that the pressure sensitive adhesive layer 1 for setting the object 6 is composed of a radiation curable pressure sensitive adhesive. Still further, it is preferred that the shrinkable film and the expansible film are laminated via an adhesive layer having an elastic modulus of at least $1.0 \times 10^5$ N/m².

The pressure sensitive adhesive sheet for producing chip of the present invention can suitably be employed in uses other than for producing a chip as described above, for example, for temporary fixing of electronic device products and surface protection.

EFFECT OF THE INVENTION

In the present invention, satisfactory uniform chip spacings can be obtained without the problems of tearing of a pressure sensitive adhesive sheet for producing chip and unsatisfactory chip spacings. The pressure sensitive adhesive sheet for producing chip of the present invention is free from deformation in the thickness direction, so that it is most suitable for automization of a production line. Moreover, the ratio of expansion of chip spacings can freely be controlled by appropriately setting shrinkage conditions such as temperature and time to thereby enable attaining a productivity enhancement.

EXAMPLE

The present invention will be illustrated in detail below with reference to the following Examples which in no way limit the scope of the invention.

In the following Examples and Comparative Example, the chip spacing and the chip alignment were evaluated in the following manner.

Chip Spacing

An 8 inch silicon wafer was set on the pressure sensitive adhesive layer 1 for setting the object 6 of the pressure sensitive adhesive sheet for producing chip produced in each of the following Examples and Comparative Example, and the pressure sensitive adhesive sheet for producing chip was fixed by means of a ring frame. The wafer was diced by the customary procedure into 10 mm×10 mm IC chips.

Thereafter, the pressure sensitive adhesive sheet for producing chip was heat treated at 90° C. for 1 min. Further, chip spacings after the heat treatment (in lateral direction (=X) and longitudinal direction (=Y) on orientation flat of the wafer) were measured by the use of an optical microscope.

Chip Alignment

The chip alignment was evaluated by the following formula using the data obtained in the measurement of the chip spacing.

$$\text{Chip alignment} = \frac{\text{Standard deviation of chip spacings}}{\text{Average value of chip spacings}}$$

(The smaller value indicates excellent chip alignment)

Example 1

1(1) Production of Pressure Sensitive Adhesive 1 for Setting the Object 100 parts by weight of an acrylic pressure sensitive adhesive (copolymer of n-butyl acrylate and acrylic acid), 200 parts by weight of a urethane acrylate oligomer having a molecular weight of 7000, 10 parts by weight of a crosslinking agent (isocyanate type) and 10 parts by weight of an ultraviolet curable reaction initiator (benzophenone type) were mixed together, thereby obtaining an ultraviolet curable pressure sensitive adhesive composition for setting the object.

1(2) Adhesive 3 for Films Bonding

A polyurethane type adhesive (elastic modulus of $3.0 \times 10^8$ N/m²) was used as the adhesive for films bonding.

1(3) Lamination of Shrinkable Film and Expansible Film

An expansible ethylene/methacrylic acid copolymer film (having a thickness of 100 μm and an elastic modulus of $2.15 \times 10^8$ N/m$^2$) was coated with the adhesive of step 1(2) above so that the thickness of the coating was 5 μm and heated at 100° C. for 30 seconds. Thereafter, a thermally shrinkable polyethylene terephthalate film (having a thickness of 30 μm and a shrinkage ratio of 50% at 120° C.) was laminated to the adhesive side of the above coated ethylene/methacrylic acid copolymer film, thereby obtaining a laminate of shrinkable film and expansible film.

1(4) Production of Pressure Sensitive Adhesive Sheet for Producing Chip

A 25 μm thick polyethylene terephthalate film having undergone release treatment was coated with the pressure sensitive adhesive composition obtained in step 1(1) above so that the thickness of the coating was 10 μm and heated at 100° C. for 1 min, and was bonded to the side of shrinkable film of the laminate obtained in step 1(3) above. A circle of 270 mm in diameter was cut therefrom, thereby obtaining an ultraviolet curable pressure sensitive adhesive sheet for producing chip 10 having the structure of FIG. 1.

The results are given in Table 1.

Example 2

2(1) Production of Pressure Sensitive Adhesive 1 for Setting the Object

An ultraviolet curable pressure sensitive adhesive composition was produced in the same manner as in step 1(1) of Example 1.

2(2) Lamination of Shrinkable Film to Pressure Sensitive Adhesive Layer

A 25 μm thick polyethylene terephthalate film having undergone release treatment was coated with the pressure sensitive adhesive composition obtained in step 2(1) above so that the thickness of the coating was 10 μm and heated at 100° C. for 1 min. Thereafter, a thermally shrinkable polyethylene terephthalate film (having a thickness of 30 μm and a shrinkage ratio of 50% at 120° C.) was bonded to the pressure sensitive adhesive side of the coated polyethylene terephthalate film, thereby obtaining a shrinkable film having a pressure sensitive adhesive layer.

2(3) Production of Adhesive for Films Bonding 100 parts by weight of an acrylic pressure sensitive adhesive (copolymer of n-butyl acrylate and acrylic acid) and 2 parts by weight of a crosslinking agent (isocyanate type) were mixed together, thereby obtaining an adhesive composition for films bonding. The resulting adhesive had an elastic modulus of $1.0 \times 10^5$ N/m$^2$.

2(4) Lamination of Adhesive for Films Bonding to Expansible Film

A 25 μm thick polyethylene terephthalate film having undergone release treatment was coated with the adhesive composition produced in step 2(3) above so that the thickness of the coating was 25 μm and heated at 100° C. for 1 min. Thereafter, an expansible ethylene/methacrylic acid copolymer film (having a thickness of 100 μm and an elastic modulus of $2.15 \times 10^8$ N/m$^2$) was laminated to the adhesive side of the above coated polyethylene terephthalate film.

2(5) Production of Pressure Sensitive Adhesive Sheet for Producing Chip

While peeling the release treated polyethylene terephthalate film from the adhesive layer of expansible film produced in step 2(4) above, the adhesive layer side of the expansible film was bonded to the side having no pressure sensitive adhesive layer of shrinkable film having pressure sensitive adhesive layer produced in step 2(2) above. A circle of 270 mm in diameter was cut therefrom, thereby obtaining an ultraviolet curable pressure sensitive adhesive sheet for producing chip 10 having the structure of FIG. 1.

The results are given in Table 1.

Example 3

A peelable type pressure sensitive adhesive sheet for producing chip was produced in the same manner as in Example 2, except that a peelable type pressure sensitive adhesive composition comprising 100 parts by weight of an acrylic pressure sensitive adhesive (copolymer of n-butyl acrylate and 2-hydroxyethyl acrylate) and 10 parts by weight of a crosslinking agent (isocyanate type) was used as the pressure sensitive adhesive composition for setting the object.

The results are given in Table 1.

Example 4

4(1) Production of Pressure Sensitive Adhesive 1 for Setting the Object

An ultraviolet curable pressure sensitive adhesive composition was produced in the same manner as in step 1(1) of Example 1.

4(2) Lamination of Expansible film to Pressure Sensitive Adhesive Layer 1

A 25 μm thick polyethylene terephthalate film having undergone release treatment was coated with the pressure sensitive adhesive composition obtained in step 4(1) above so that the thickness of the coating was 10 μm and heated at 100° C. for 1 min. Thereafter, an expansible polyethylene/methacrylic acid copolymer film (having a thickness of 100 μm and an elastic modulus of $2.15 \times 10^8$ N/m$^2$) was laminated to the pressure sensitive adhesive side of the coated polyethylene terephthalate film.

4(3) Production of Adhesive for Films Bonding

An adhesive composition for films bonding was produced in the same manner as in step 2(3) of Example 2. 4(4) Lamination of adhesive for films bonding to shrinkable film:

A 25 μm thick polyethylene terephthalate film having undergone release treatment was coated with the adhesive composition produced in step 4(3) above so that the thickness of the coating was 25 μm and heated at 100° C. for 1 min. Thereafter, a shrinkable polyethylene terephthalate film (having a thickness of 30 μm and a shrinkage ratio of 50% at 120° C.) was bonded to the pressure sensitive adhesive layer side of the coated polyethylene terephthalate film, thereby obtaining a shrinkable film having an adhesive layer.

4(5) Production of Pressure Sensitive Adhesive Sheet for Producing Chip

While peeling the release treated polyethylene terephthalate film from the adhesive layer of shrinkable film produced in step 4(4) above, the adhesive side of the shrinkable film was bonded to the side having no pressure sensitive adhesive layer of the expansible film having the pressure sensitive adhesive layer produced in step 4(2) above. A circle of 270 mm in diameter was blanked therefrom, thereby obtaining an ultraviolet curable pressure sensitive adhesive sheet 10 for producing chip having the structure of FIG. 2.

The results are given in Table 1.

Example 5

A peelable type pressure sensitive adhesive sheet for producing chip was produced in the same manner as in Example 4, except that a peelable type pressure sensitive adhesive composition as same as Example 3 was used as the pressure sensitive adhesive composition for setting the object.

The results are given in Table 1.

Example 6

6(1) Production of Pressure Sensitive Adhesive 1 for Setting the Object

An ultraviolet curable pressure sensitive adhesive composition was produced in the same manner as in step 1(1) of Example 1.

6(2) Lamination of Expansible Film to Pressure Sensitive Adhesive Layer

An expansible film having a pressure sensitive adhesive layer composed of the pressure sensitive adhesive composition prepared in step 6(1) was produced in the same manner as in step 4(2) of Example 4.

6(3) Production of Adhesive for Films Bonding

An adhesive composition was produced in the same manner as in step 2(3) of Example 2.

6(4) Lamination of Adhesive for Films Bonding to Shrinkable Film

The shrinkable film was laminated to the films bonding adhesive layer of step 6(3) in the same manner as in step 4(4) of Example 4. A circle was cut therefrom, thereby obtaining a shrinkable film having adhesive layer with a hole of 210 mm in inside diameter.

6(5) Production of Pressure Sensitive Adhesive Sheet for Producing Chip

While peeling the release treated polyethylene terephthalate film from the shrinkable film having adhesive layer produced in step 6(4) above, the adhesive side of the shrinkable film was bonded to the side having no pressure sensitive adhesive layer of the expansible film having pressure sensitive adhesive layer produced in step 6(2) above. A circle of 270 mm in diameter being concentric with the above hole was blanked therefrom, thereby obtaining an ultraviolet curable pressure sensitive adhesive sheet for producing chip having the structure of FIG. 6.

The results are given in Table 1.

Example 7

7(1) Production of Pressure Sensitive Adhesive 1 for Setting the Object

A peelable pressure sensitive adhesive composition was produced in the same manner as in step 3(1) of Example 3.

7(2) Lamination of Expansible Film to Pressure Sensitive Adhesive Layer

An expansible film having a pressure sensitive adhesive layer composed of the pressure sensitive adhesive composition prepared in step 7(1) was produced in the same manner as in step 4(2) of Example 4.

7(3) Production of Pressure Sensitive Adhesive for Immobilizing Ring Frame

A pressure sensitive adhesive composition having the same composition as in step 2(3) of Example 2 was produced.

7(4) Lamination of Pressure Sensitive Adhesive for Immobilizing Ring Frame to Shrinkable Film The same procedure as in step 6(4) of Example 6 was repeated except that the pressure sensitive adhesive composition obtained in step 7(3) above was applied in a thickness of 10 μm, thereby obtaining a shrinkable film having a pressure sensitive adhesive layer of step 7(3) with a hole of 210 mm in inside diameter.

7(5) Production of Pressure Sensitive Adhesive Sheet for Producing Chip

While peeling the release treated polyethylene terephthalate film from the peelable pressure sensitive adhesive layer of expansible film produced in step 7(2) above, the pressure sensitive adhesive side of the expansible film was bonded to the side having no pressure sensitive adhesive layer of the shrinkable film having pressure sensitive adhesive layer produced in step 7(4) above. A circle of 270 mm in diameter being concentric with the above hole was blanked therefrom, thereby obtaining a peelable type pressure sensitive adhesive sheet for producing chip having the structure of FIG. 3.

The results are given in Table 1.

Comparative Example 1

The same procedure as in Example 2 was repeated except that the expansible substrate was replaced by a nonexpansible substrate (polyethylene terephthalate film of 100 μm in thickness having an elastic modulus of $4.53 \times 10^9$ N/m²).

The results are given in Table 1.

TABLE 1

| | Chip spacing (μm) | | Chip alignment | |
|---|---|---|---|---|
| | X-axis | Y-axis | X-axis | Y-axis |
| Example 1 | 850 | 850 | 0.06 | 0.07 |
| Example 2 | 750 | 750 | 0.13 | 0.17 |
| Example 3 | 750 | 750 | 0.20 | 0.21 |
| Example 4 | 400 | 400 | 0.20 | 0.23 |
| Example 5 | 400 | 400 | 0.25 | 0.30 |
| Example 6 | 250 | 250 | 0.28 | 0.30 |
| Example 7 | 250 | 250 | 0.36 | 0.38 |
| Comparative Example 1 | 35 | 35 | 0.41 | 0.42 |

What is claimed is:

1. A pressure sensitive adhesive sheet for producing a chip, comprising:

an expansible film;

a pressure sensitive adhesive layer including an area for setting an object to be diced; and at least one layer of a shrinkable film having a shrinkage ratio of 10–90% upon heating to 120° C., wherein a shrinkage area formed by the shrinkable film is at least partially located outside of said area for setting the object to be diced, wherein the shrinkable film includes one or more members selected from polyethylene terephthalate, polyethylene, polystyrene, polypropylene, polyamide, polyurethane, polyvinylidene chloride and polyvinyl chloride, and wherein the shrinkable film and the expansible film are laminated via an adhesive layer having an elastic modulus of at least $1.0 \times 10^5$ N/m².

2. The pressure sensitive adhesive sheet for producing chip of claim 1, wherein the expansible film has an elastic modulus of less than $1 \times 10^9$ N/m².

3. The pressure sensitive adhesive sheet for producing chip of claim 1, wherein the pressure sensitive adhesive layer for setting the object is composed of a radiation curable pressure sensitive adhesive.

4. The pressure sensitive adhesive sheet for producing chip of claim 2, wherein the pressure sensitive adhesive layer for setting the object is composed of a radiation curable pressure sensitive adhesive.

5. A pressure sensitive adhesive sheet for producing a chip, comprising:

an expansible film;

a pressure sensitive adhesive layer including an area for setting an object to be diced; and at least one layer of a shrinkable film having a shrinkage ratio of 10–90% upon heating to 120° C., wherein a shrinkage area formed by the shrinkable film is at least partially located outside of said area for setting the object to be diced, wherein the shrinkable film includes one or more members selected from polyethylene terephthalate, polyethylene, polystyrene, polypropylene, polyamide, polyurethane, polyvinylidene chloride and polyvinyl chloride, wherein the shrinkable film and the expansible film are laminated via an adhesive layer having an elastic modulus of at least $1.0 \times 10^5$ N/m², and wherein the pressure sensitive adhesive layer for setting the object, the shrinkable film and the expansible film are laminated in an ordered array in which the pressure sensitive adhesive layer is connected to the shrinkable film and the shrinkable film is connected to the expansible film.

6. The pressure sensitive adhesive sheet for producing chip of claim 5, wherein the expansible film has an elastic modulus of less than $1 \times 10^9$ N/m$^2$.

7. The pressure sensitive adhesive sheet for producing chip of claim 5, wherein the pressure sensitive adhesive layer for setting the object is composed of a radiation curable pressure sensitive adhesive.

8. A pressure sensitive adhesive sheet for producing a chip, comprising:

an expansible film;

a pressure sensitive adhesive layer including an area for setting an object to be diced; and at least one layer of a shrinkable film having a shrinkage ratio of 10–90% upon heating to 120° C., wherein a shrinkage area formed by the shrinkable film is at least partially located outside of said area for setting the object to be diced, wherein the shrinkable film includes one or more members selected from polyethylene terephthalate, polyethylene, polystyrene, polypropylene, polyamide, polyurethane, polyvinylidene chloride and polyvinyl chloride, wherein the shrinkable film and the expansible film are laminated via an adhesive layer having an elastic modulus of at least $1.0 \times 10^5$ N/m$^2$, and wherein the pressure sensitive adhesive layer for setting the object, the expansible film and the shrinkable film are laminated in an ordered array in which the pressure sensitive adhesive layer is connected to the expansible film and the expansible film is connected to the shrinkable film.

9. The pressure sensitive adhesive sheet for producing chip of claim 8, wherein the expansible film has an elastic modulus of less than $1 \times 10^9$ N/m$^2$.

10. The pressure sensitive adhesive sheet for producing chip of claim 8, wherein the pressure sensitive adhesive layer for setting the object is composed of a radiation curable pressure sensitive adhesive.

11. A pressure sensitive adhesive sheet for producing a chip, comprising:

an expansible film having an elastic modulus of less than $1 \times 10^9$ N/m$^2$;

a pressure sensitive adhesive layer including an area for setting an object to be diced; and at least one layer of a shrinkable film having a shrinkage ratio of 10–90% upon heating to 120° C., wherein a shrinkage area formed by the shrinkable film is at least partially located outside of said area for setting the object to be diced, wherein the shrinkable film includes one or more members selected from polyethylene terephthalate, polyethylene, polystyrene, polypropylene, polyamide, polyurethane, polyvinylidene chloride and polyvinyl chloride, and wherein the shrinkable film and the expansible film are laminated via an adhesive layer having an elastic modulus of at least $1.0 \times 10^5$ N/m$^2$.

* * * * *